United States Patent
Todoroki

[19]

[11] Patent Number: 5,809,044
[45] Date of Patent: Sep. 15, 1998

[54] METHOD OF AND CIRCUIT FOR DETECTING SYNCHRONISM IN VITERBI DECODER

[75] Inventor: Toshiya Todoroki, Tokyo, Japan

[73] Assignee: NEC Corporation, Japan

[21] Appl. No.: 675,517

[22] Filed: Jun. 27, 1996

Related U.S. Application Data

[63] Continuation of Ser. No. 172,617, Dec. 22, 1993, abandoned.

[30] Foreign Application Priority Data

Dec. 25, 1992 [JP] Japan .................................. 4-345858

[51] Int. Cl.$^6$ .................................................. G06F 11/10
[52] U.S. Cl. ................ 371/43.1; 371/37.03; 371/37.11; 371/46
[58] Field of Search ................ 371/43, 44, 45, 371/46, 43.1, 37.03, 37.11

[56] References Cited

U.S. PATENT DOCUMENTS

| | | | |
|---|---|---|---|
| 4,675,871 | 6/1987 | Gordon et al. | 371/46 |
| 4,802,174 | 1/1989 | Hiraiwa et al. | 371/46 |
| 4,837,766 | 6/1989 | Yoshida | 371/46 |
| 4,918,446 | 4/1990 | Yagi | 341/94 |
| 5,208,816 | 5/1993 | Seshardi et al. | 371/43 |
| 5,398,254 | 3/1995 | Miya et al. | 371/43 |

FOREIGN PATENT DOCUMENTS

| | | |
|---|---|---|
| 0233788 | 8/1987 | European Pat. Off. . |
| 0425153 | 5/1991 | European Pat. Off. . |
| 2123655 | 2/1984 | United Kingdom . |

OTHER PUBLICATIONS

"Improved HF modem using convoultional coding", B. Honary et al., *Electronics & Communication Engineering Journal*, No. 2, pp. 73–82, Apr. 1992.

*Primary Examiner*—Paul P. Gordon
*Assistant Examiner*—Marc McDieunel
*Attorney, Agent, or Firm*—Ostrolenk, Faber, Gerb & Soffen, LLP

[57] ABSTRACT

A branch value output circuit checks a preceding state to which a maximum path metric state determined in a Viterbi decoding process by a Viterbi decoder has transited, uses the maximum path metric state, and determines a branch value between transitions. A correlator determines a correlation in each interval between the branch value and soft-decided received data and outputs a correlative value representing the correlation in each interval. A synchronism/asynchronism determining circuit determines whether the received data are in a synchronous or asynchronous condition based on the correlative value in each interval. If the received data are determined to be in an asynchronous condition by the synchronism/asynchronism determining circuit, the synchronism/asynchronism determining circuit supplies a phase control signal to a phase converter. The phase converter changes the phase of the received data in response to the phase control signal. Therefore, it can be detected whether the soft-decided received data are in the synchronous or asynchronous condition, and if the received data are in the asynchronous condition, the received data are controlled into the synchronous condition.

4 Claims, 5 Drawing Sheets

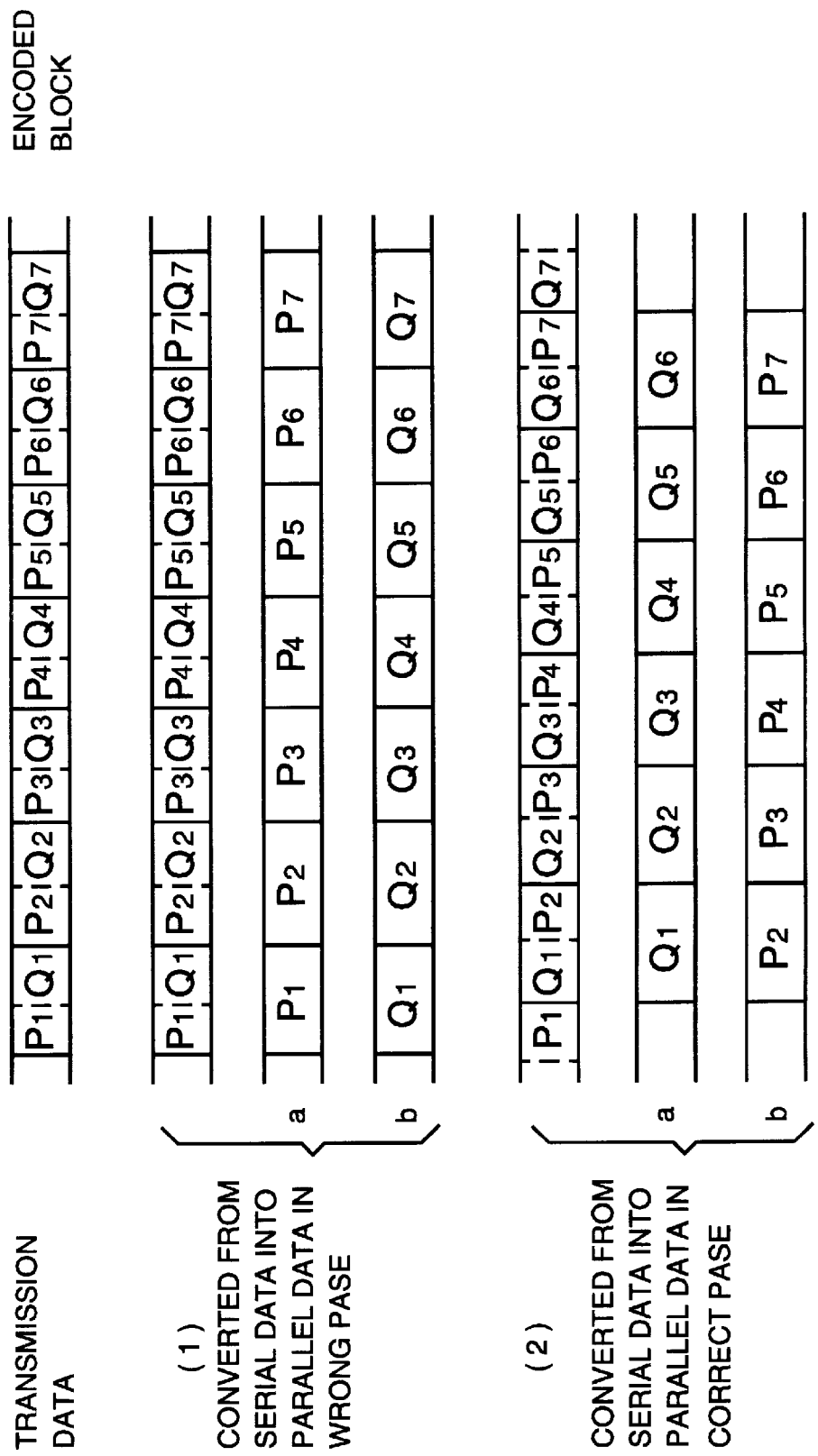

—— INPUTED "0" INTO ENCODER
- - - INPUTED "1" INTO ENCODER

METHOD OF AND CIRCUIT FOR DETECTING SYNCHRONISM IN VITERBI DECODER

This is a Continuation of Application Ser. No. 08/172,617 filed on Dec. 22, 1993, now abandoned.

BACKGROUND OF THE INVENTION

1. Field of the Invention

The present invention relates to a Viterbi decoder for use in satellite communication systems, and more particularly to a method of and a circuit for detecting synchronism and asynchronism in a Viterbi decoder.

2. Description of the Related Art

As is well known in the art, a convolutional encoder is characterized by an information rate R and a constraint length K of a code. When k information bits of an information series are encoded into n code bits of a code series, the information rate R of a code is given as k/n. For example, if one information bit of an information series is expressed by two code bits of a code series, then the information rate R is ½. The information rate R of a code is also called a coded ratio. The constraint length K refers to a range affected by information bits of a certain block, and is represented by K=(m+1)n where m is the degree m of a code generator polynomial and n is the length of a partial block.

A convolutional code is a code where information is encoded in blocks and information in past blocks affects a present block. Blocks that are encoded are called code blocks.

A convolutional encoder can take a plurality of internal states. Specifically, if the number of delay elements contained in a convolutional encoder is d, then since each of the delay elements can take a logic "1" or "0", the convolutional encoder can take $2^d$ internal states. The convolutional encoder undergoes a transition from one internal state to another each time it is supplied with k information bits of an information series. The manner in which the internal states of the convolutional encoder change is represented by a trellis transition diagram which is well known in the art. The trellis transition diagram is a representation of internal states as they change and outputs plotted against a horizontal axis indicative of time. When data are transmitted, i.e., when an information series is encoded into a code series, the internal state of the convolutional encoder shifts from an initial state to a final state.

The present invention is concerned with a method of detecting synchronism in a Viterbi decoder which receives through a transmission path code data that are encoded from an information series by a convolutional encoder and decodes the received code data using a Viterbi algorithm.

As well known in the art, the application of an error-correcting code to information transmitted in a satellite communication requires that a receiver decode received data while correctly recognizing the division of code blocks at a transmitter. A condition in which the division of code blocks at a transmitter and the division of code blocks at a receiver do not agree with each other is referred to as an asynchronous condition. The receiver cannot properly decode received data in an asynchronous condition. It is therefore necessary to detect an asynchronous condition with an error-correcting coder and control the phase of the received data supplied to a decoder so that the decoder can decode the received data in proper code blocks at all times. To meet this requirement, synchronous information which clearly distinguishes between the synchronous and asynchronous conditions should be extracted from the decoder.

For decoding a series of data (received data) encoded at a coded ratio of ½ by a convolutional encoder in a transmitter, there is generally employed a Viterbi decoder which decodes the received data using a Viterbi algorithm. Various synchronism detecting methods have therefore been proposed for effecting Viterbi decoding on received data in proper code blocks (see, for example, Japanese laid-open patent publications Nos. 62-193323, 63-232650, 1-296716, 2-237334, and 3-13025).

One conventional method of detecting synchronism in a Viterbi decoder will be described below with reference to FIG. 1 of the accompanying drawings. FIG. 1 shows, by way of example, a circuit arrangement disclosed in an article entitled "Analysis of a Code Synchronizing Process in Viterbi Decoding" written by Yutaka Yasuda, et al. pages 17–24, Technical Research Report (CS82 - 43), Electronic Communications Society.

Soft-decided received data are supplied to an input terminal 110. Generally, a received signal that has been sent through analog transmission contains noise. For example, after being transmitted, a logic level "0" may change to a level 0.2 or a logic level "1" may change to a level "0.7" due to noise. The soft-decided received data are data that are not immediately put back into a logic level "0" or a logic level "1," but are handled as analog data. Hard-decided received data are data that are restored from soft-decided received data to a logic level "0" or a logic level "1."

The soft-decided received data supplied to the input put terminal 110 are then supplied to a serial-to-parallel converter 118, which supplies data a, b to a phase converter 111. The phase converter 111 keeps the data a, b in the same phase until it is supplied with a phase control signal from a synchronism/asynchronism decision circuit 116.

In response to a phase control signal from the synchronism/asynchronism decision circuit 116, the phase converter 111 generates phase-converted soft-decided received data c, d and hard-decided received data. The phase converter 111 supplies the phase-converted soft-decided received data c, d to a Viterbi decoder 112, and also supplies the hard-decided received data to a delay circuit 115. The Viterbi decoder 112 decodes the supplied phase-converted soft-decided received data c, d using a known Viterbi algorithm. The decoded data are outputted from an output terminal 117 and also supplied to a convolutional encoder 113. The convolutional encoder 113 encodes the decoded data into convolutional coded data, which are supplied to a correlator 114. The correlator 114 is also supplied with the hard-decided received data that have been delayed by the delay circuit 115. The delay circuit 115 serves to time the hard-decided received data to the convolutional coded data. The correlator 114 detects a correlation between the convolutional coded data and the delayed hard-decided received data in each interval, and outputs a correlative value indicative of the detected correlation in each interval.

The correlative value thus produced tends to be small in an asynchronous condition. The correlative value in each interval is supplied to the synchronism/asynchronism decision circuit 116. The synchronism/asynchronism decision circuit 116 compares the supplied correlative value in each interval with a predetermined threshold, and determines whether the received data are in the synchronous condition or asynchronous condition based on the result of the comparison. If the received data are in an asynchronous condition, then the synchronism/asynchronism decision circuit 116 supplies the phase control signal to the phase converter 111. In response to the phase control signal, the phase converter 111 changes the phase of the soft-decided received data.

As shown in FIG. 2 of the accompanying drawings, if the data (a, b) supplied to the phase converter 111 are (a, b)=($Q_t$, $P_{t+1}$), then the received data are determined as being in an asynchronous condition, and the phase converter 111 changes the phase of the data so that the data (c, d) become (c, d)=($P_t$, $Q_t$) This process is repeated until the synchronism/asynchronism decision circuit 116 determines the received data as being in the synchronous condition.

However, the conventional method of detecting synchronism in a Viterbi decoder requires an extra period of time for a decoding delay caused by the Viterbi decoder and an encoding delay caused by the convolutional encoder for the extraction of synchronous information. The decoding and encoding processes need the delay circuit and the convolutional encoder.

SUMMARY OF THE INVENTION

It is therefore an object of the present invention to provide a method of detecting synchronism and asynchronism in a Viterbi decoder, the method being capable of bringing received data into a synchronous condition if the received data are detected as being in an asynchronous condition.

According to the present invention, there is provided a method of detecting synchronism in a Viterbi decoder for decoding convolutionally encoded received data using a Viterbi algorithm, comprising the steps of checking a preceding state to which a maximum path metric state determined in a Viterbi decoding process by the Viterbi decoder has transited, using said maximum path metric state, and determining a branch value between transitions, determining a correlation in each interval between said branch value and the received data and outputting a correlative value representing said correlation in each interval, determining whether the received data are in a synchronous or asynchronous condition based on said correlative value in each interval, and changing the phase of the received data if the received data are determined as being in an asynchronous condition.

According to the present invention, there is also provided a circuit for detecting synchronism in a Viterbi decoder for decoding convolutionally encoded received data using a Viterbi algorithm, comprising a branch value output circuit for checking a preceding state to which a maximum path metric state determined in a Viterbi decoding process by the Viterbi decoder has transited, using said maximum path metric state, and determining a branch value between transitions; a correlator for determining a correlation in each interval between said branch value and the received data and outputting a correlative value representing said correlation in each interval; a synchronism/asynchronism determining circuit for determining whether the received data are in a synchronous or asynchronous condition based on said correlative value in each interval; and a phase converter for changing the phase of the received data if the received data are determined as being in an asynchronous condition by said synchronism/asynchronism determining circuit.

In the above method and circuit, the received data may comprise soft-decided received data.

The above and other objects, features, and advantages of the present invention will become apparent from the following description when taken in conjunction with the accompanying drawings which illustrate a preferred embodiment of the present invention by way of example.

BRIEF DESCRIPTION OF THE DRAWINGS

FIG. 2 is a diagram showing data that are in different combinations when they are converted from serial data into parallel data;

DETAILED DESCRIPTION OF THE PREFERRED EMBODIMENT

Figure 1:
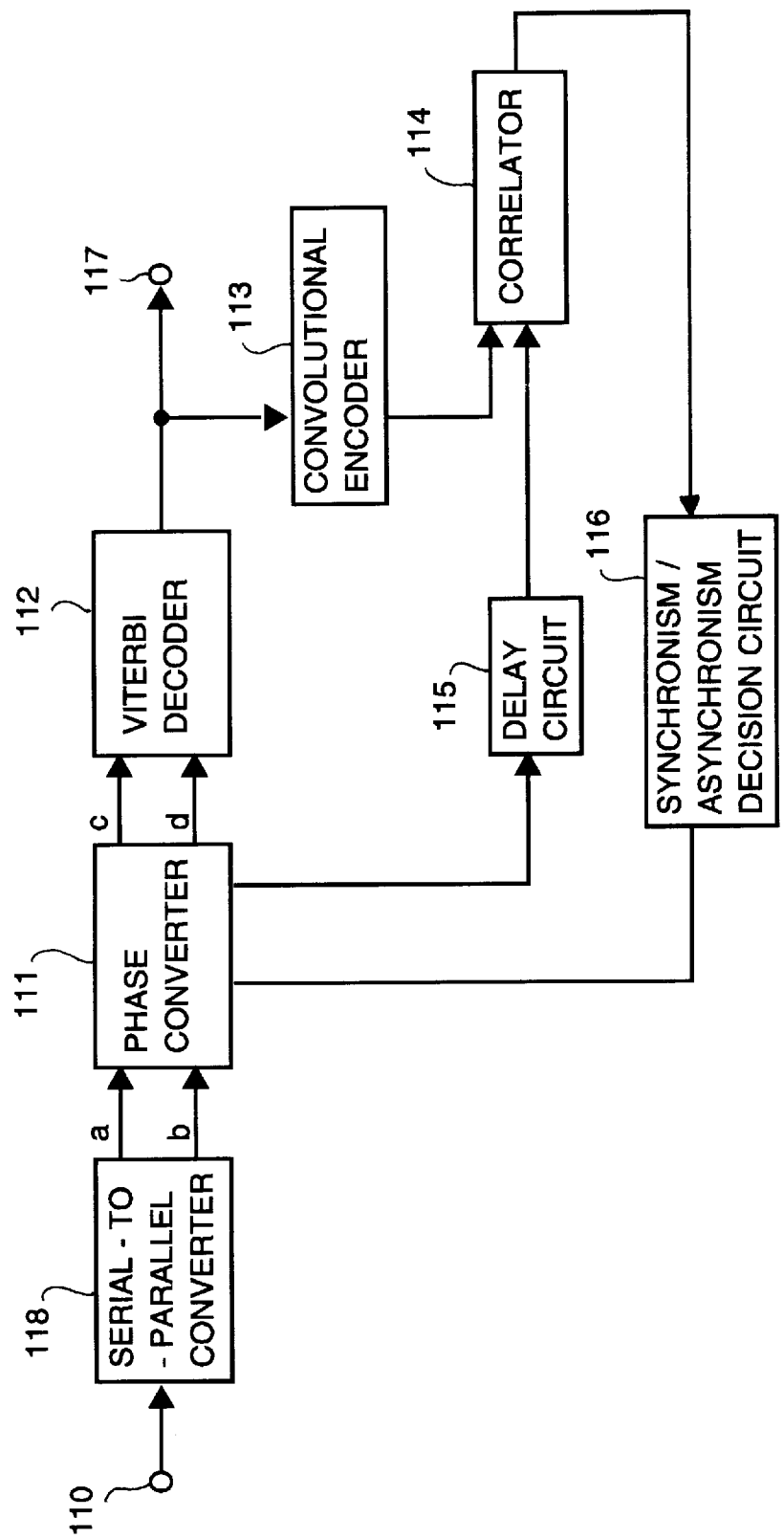
FIG. 1 is a block diagram of a circuit arrangement for carrying out a conventional method of detecting synchronism in a Viterbi decoder.
Figure 3A:
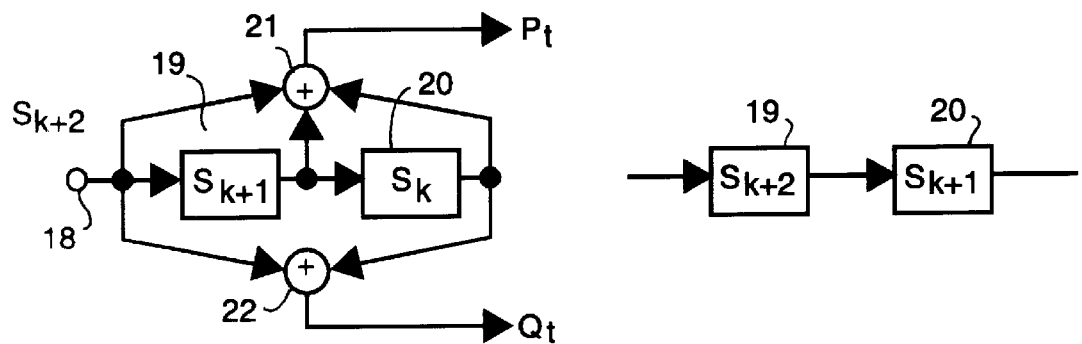
FIGS. 3(a) through 3(c) are diagrams showing a convolutional encoder which is used in a transmitter with a Viterbi decoder according to the present invention, and the manner in which the convolutional encoder operates.

As shown in FIG. 3(a), a convolutional encoder which is used in a transmitter with a Viterbi decoder according to the present invention has an input terminal 18, first and second registers 19, 20, and first and second adders 21, 22.

When an information bit $S_{k+2}$ is supplied to the input terminal 18, the first and second registers 19, 20 are holding respective information bits $S_{k+1}$, $S_k$. At this time, the first and second adders 21, 22 carry out the following equations (1), (2), respectively:

$$P_t = S_{k+2} + S_{k+1} + S_k \pmod 2 \qquad (1),$$

$$Q_t = S_{k+2} + S_k \pmod 2 \qquad (2).$$

Figure 3B:
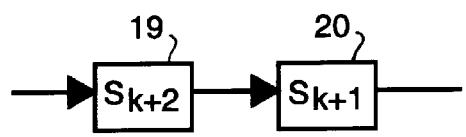

The first and second adders 21, 22 output first and second sums $P_t$, $Q_t$, respectively, where t represents time. The set ($P_t$, $Q_t$) of first and second sums $P_t$, $Q_t$ represents a code block that is transmitted at the time t. At the same time that succeeding information is supplied to the input terminal 18, the contents of the first and second adders 21, 22 vary as shown in FIG. 3(b), i.e., first and second adders 21, 22 hold respective information bits $S_{k+2}$, $S_{k+1}$.

Figure 3C:
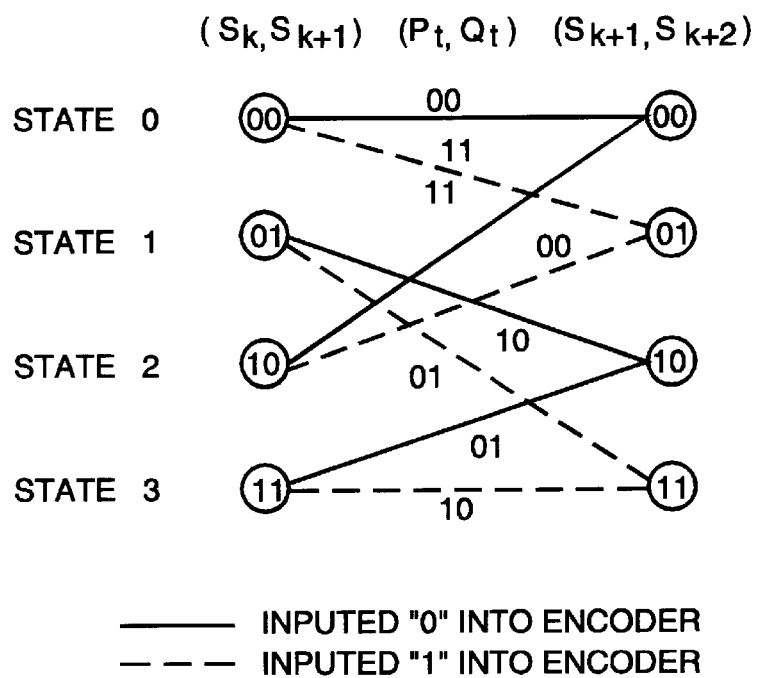

FIG. 3(c) illustrates how the contents of the first and second registers 19, 20 vary and what code block ($P_t$, $Q_t$) is outputted depending on the values held by the first and second registers 19, 20 and the information bit supplied to the input terminal 18. It is assumed that the condition in which the first and second registers 19, 20 hold respective values (0, 0) is referred to as a state 0, the condition in which the first and second registers 19, 20 hold respective values (1, 0) is referred to as a state 1, the condition in which the first and second registers 19, 20 hold respective values (0, 1) is referred to as a state 2, and the condition in which the first and second registers 19, 20 hold respective values (1, 1) is referred to as a state 3.

Figure 4:
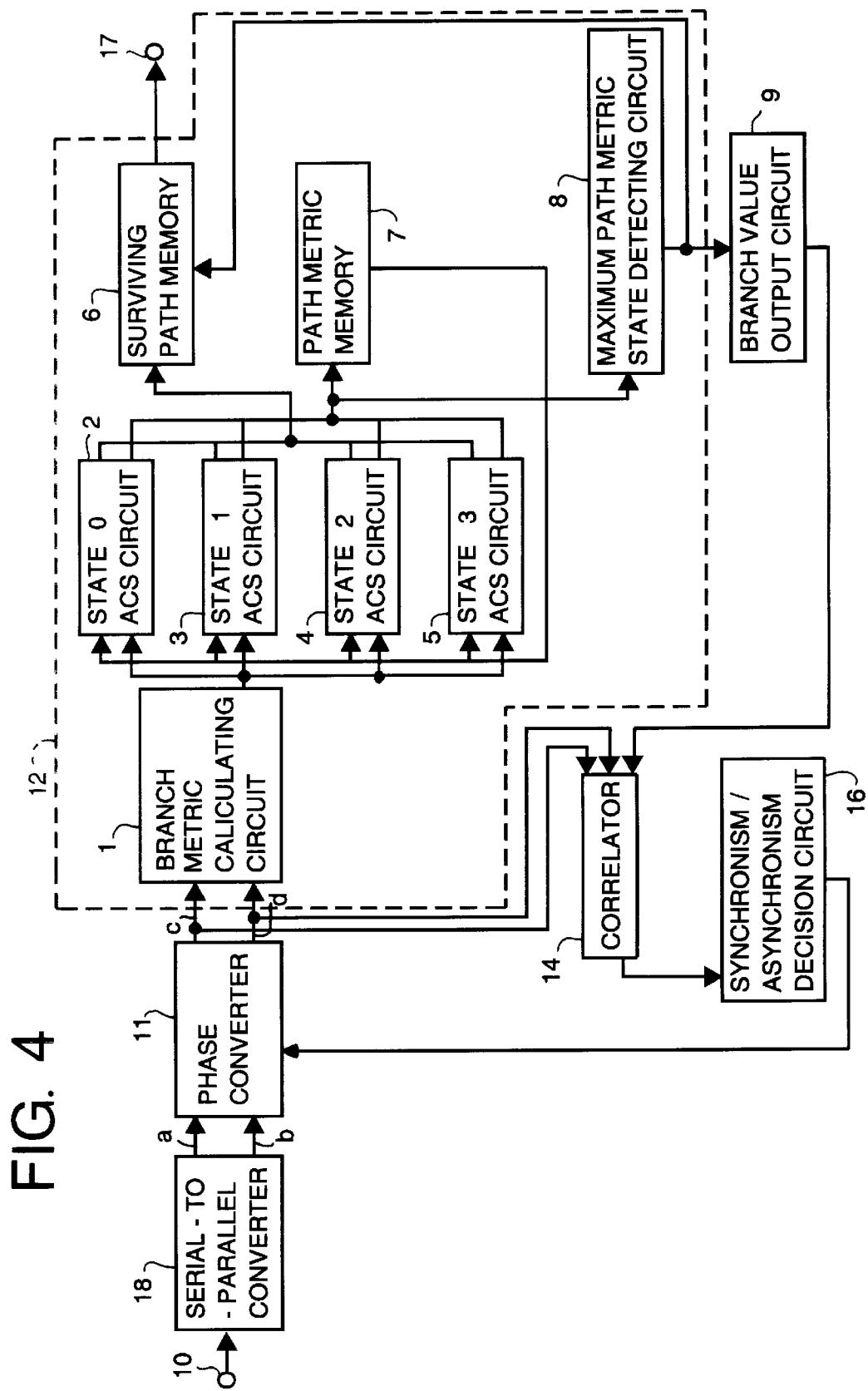
FIG. 4 is a block diagram of a circuit for detecting synchronism in a Viterbi decoder according to the present invention.

FIG. 4 shows in block form a circuit for detecting synchronism in a Viterbi decoder according to the present invention. In FIG. 4, soft-decided received data supplied from an input terminal 10 are supplied through a serial-to-parallel converter 18 and a phase converter 11 successively as sets ($P_t$, $Q_t$) (synchronous condition) or sets ($Q_t$, $P_{t+1}$) (asynchronous condition) to a Viterbi decoder 12, with each code block as one unit (c, d).

The Viterbi decoder 12 comprises a branch metric calculating circuit 1, a state-0 adding, comparing, and selecting (ACS) circuit 2, a state-1 ACS circuit 3, a state-2 ACS circuit 4, a state-3 ACS circuit 5, a surviving path memory 6, a path metric memory 7, and a maximum path metric state detecting circuit 8.

The branch metric calculating circuit 1 calculates branch metrics with respect to the branches (c, d) shown in FIG. 3(c) based on input data in each decoding step. The path metric memory 7 stores path metric information of surviving paths in a preceding decoding step with respect to the states 0, 1, 2, 3 of the information bit set ($S_{k+1}$, $S_{k+2}$) shown in FIG. 3(c). The state-0 ACS circuit 2, state-1 ACS circuit 3, state-2 ACS circuit 4, and state-3 ACS circuit 5 select new surviving paths of the states 0, 1, 2, 3 based on the branch metrics calculated by the branch metric calculating circuit 1 and the path metric information stored in the path metric memory 7.

The metrics of the selected surviving paths and the contents (the information bit $S_{k+2}$ shown in FIG. 3(c)) of an encoder input data series with respect to the paths are stored in the surviving path memory 6. At this time, the data bit inputted at the most distant past time through the surviving path with respect to the condition that has been determined by the maximum path metric state detecting circuit 8 is outputted as decoded data from an output terminal 17.

According to the present invention, as will be described in detail below, synchronous information is extracted from the output signal of the maximum path metric state detecting circuit 8 which is produced in a Viterbi decoding process that is a repetition of the above operation.

Figure 5:
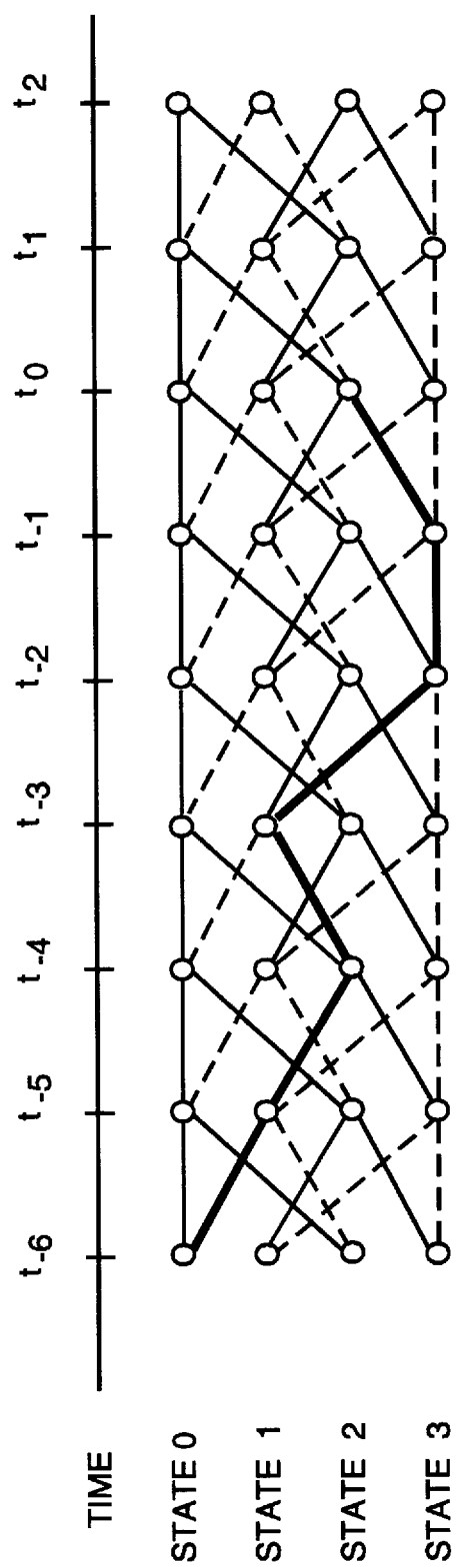
FIG. 5 is a trellis transition diagram illustrative of a branch value output circuit in the circuit shown in FIG. 4.

FIG. 5 shows a trellis transition diagram by way of example. The thick lines in FIG. 5 indicate a surviving path having a maximum path metric in the surviving path memory 6 at a time $t_0$ in the synchronous condition. In FIG. 5, state 2 has a maximum path metric at the time $t_0$ and can be determined by the maximum path metric state detecting circuit 8.

The branch value output circuit 9 determines where the determined state with the maximum path metric has transited from, and outputs a branch value ($P_t$, $Q_t$) between transitions. It can be seen from FIG. 5 that state 2, which has the maximum oath metric at time $t_0$, has transited from state 3. Therefore, the branch value output circuit 9 outputs (0, 1) as the branch value ($P_t$, $Q_t$). A series obtained from the branch value output circuit 9 is not a complete coded series, but a series close to the complete coded series. A series in an asynchronous condition is random.

The branch value outputted from the branch value output circuit 9 is supplied to a correlator 14. The correlator 14 detects a correlation between the branch value and the hard-decided received data in each interval, and outputs a correlative value indicative of the detected correlation in each interval. The correlative value thus produced in each interval is supplied to a synchronism/asynchronism decision circuit 16. The synchronism/asynchronism decision circuit 16 compares the supplied correlative value in each interval with a predetermined threshold and determines whether the received data are in the synchronous condition or asynchronous condition based on the result of the comparison. If the received data are in an asynchronous condition, then the synchronism/asynchronism decision circuit 16 supplies the phase control signal to the phase converter 11. In response to the phase control signal, the phase converter 11 changes the phase of the soft-decided received data.

In FIG. 2, if the data (a, b) supplied to the phase converter 11 are (a, b)=($Q_t$, $P_{t+1}$), then the received data are determined to be in an asynchronous condition, and the phase converter 11 changes the phase of the data so that the data (c, d) become (c, d)=($P_t$, $Q_t$). This process is repeated until the synchronism/asynchronism decision circuit 16 determines that the received data is in the synchronous condition.

As described above, since the detected state with the maximum path metric produced in the Viterbi decoding process is used to extract the synchronous condition, the period of time which would otherwise be caused by a delay in Viterbi decoding and a delay in re-encoding is not required, allowing the synchronous or asynchronous condition to be detected quickly. The circuit for detecting synchronism and asynchronism in a Viterbi decoder may therefore be reduced in size because there is no need for the delay circuit or convolutional encoder which would otherwise be necessary in the conventional synchronism detecting circuit.

Although a certain preferred embodiment of the present invention has been shown and described in detail, it should be understood that various changes and modifications may be made therein without departing from the scope of the appended claims.

What is claimed is:

1. A method of detecting synchronism in a Viterbi decoder for decoding convolutionally encoded received data using a Viterbi algorithm, comprising the steps of:

checking a preceding state to which a maximum path metric state determined in a Viterbi decoding process by the Viterbi decoder has transited, using said maximum path metric state, and determining a branch value between transitions;

determining a correlation for every prescribed received data between said branch value and an output data of a phase converter whose input is the received data and outputting a correlative value representing said correlation;

determining whether the received data are in a synchronous or asynchronous condition based on said correlative value; and changing the phase of the received data with said phase converter if the received data are determined as being in the asynchronous condition.

2. The method according to claim 1 wherein the received data comprise soft-decided received data.

3. A circuit for detecting synchronism in a Viterbi decoder for decoding convolutionally encoded received data using a Viterbi algorithm, comprising:

a branch value output circuit for checking a preceding state to which a maximum path metric state determined in a Viterbi decoding process by the Viterbi decoder has transited, using said maximum path metric state, and determining a branch value between transitions;

a phase converter for changing the phase of the received data;

a correlator for determining a correlation for every prescribed received data between said branch value and an output data of said phase converter the received data and outputting a correlative value representing said correlation; and a synchronism/asynchronism determining circuit for determining whether the received data are in a synchronous or asynchronous condition based on said correlative value, said phase converter changing the phase of the received data if the received data are determined as being in the asynchronous condition by said synchronism/asynchronism determining circuit.

4. A circuit according to claim 3 wherein the received data comprise soft-decided received data.

* * * * *